(12) United States Patent
Eymard et al.

(10) Patent No.: US 10,592,796 B2
(45) Date of Patent: Mar. 17, 2020

(54) CHIP CARD MANUFACTURING METHOD, AND CHIP CARD OBTAINED BY SAID METHOD

(71) Applicant: Linxens Holding, Mantes la Jolie (FR)

(72) Inventors: Eric Eymard, Pollgnac (FR); Cyril Proye, Magnanville (FR); Nicolas Guerineau, Pontoise (FR); Christophe Paul, Courcelles sur Seine (FR)

(73) Assignee: Linxens Holding, Mantes la Jolie (FR)

( * ) Notice: Subject to any disclaimer, the term of this patent is extended or adjusted under 35 U.S.C. 154(b) by 27 days.

(21) Appl. No.: 15/515,675

(22) PCT Filed: Sep. 30, 2015

(86) PCT No.: PCT/FR2015/052621
§ 371 (c)(1),
(2) Date: Mar. 30, 2017

(87) PCT Pub. No.: WO2016/051092
PCT Pub. Date: Apr. 7, 2016

(65) Prior Publication Data
US 2017/0249545 A1    Aug. 31, 2017

(30) Foreign Application Priority Data
Sep. 30, 2014   (FR) ..................... 14 59310

(51) Int. Cl.
*G06K 19/077*   (2006.01)
*G06K 19/067*   (2006.01)

(52) U.S. Cl.
CPC ... *G06K 19/07749* (2013.01); *G06K 19/0775* (2013.01); *G06K 19/07747* (2013.01);
(Continued)

(58) Field of Classification Search
CPC ....... G06K 19/07749; G06K 19/07747; G06K 19/0775; G06K 19/07754; G06K 19/067;
(Continued)

(56) References Cited

U.S. PATENT DOCUMENTS 5,217,597 A * 6/1993 Moore ................ H01L 21/4853
                                            205/123
5,219,117 A * 6/1993 Lin .................... B23K 35/0244
                                            228/246
(Continued)

FOREIGN PATENT DOCUMENTS

DE    197 09 985 A1    9/1998
EP    1 498 843 A2    1/2005
(Continued)

*Primary Examiner* — Thien M Le
*Assistant Examiner* — Asifa Habib
(74) *Attorney, Agent, or Firm* — Harrington & Smith

(57) ABSTRACT

A chip card manufacturing method. A module includes a substrate supporting contacts on one surface and conductive paths and a chip on another; and an antenna on a holder, the antenna including a contact pad for respectively connecting to each of the ends thereof. A solder drop is placed on each of the contact pads of the antenna. The holder of the antenna is inserted between plastic layers. A cavity is provided, in which the module can be accommodated and the solder drops remain accessible. The height of the solder drops before heating is suitable for projecting into the cavity. A module is placed in each cavity. The areas of the module that are located on the solder drops are heated to melt the solder and to solder the contact pads of the antenna to conductive paths of the module.

30 Claims, 5 Drawing Sheets

(52) U.S. Cl.
CPC . *G06K 19/07754* (2013.01); *G06K 19/07769* (2013.01); *G06K 19/067* (2013.01); *G06K 19/077* (2013.01); *G06K 19/07722* (2013.01); *H01L 2224/16225* (2013.01); *H01L 2224/16227* (2013.01); *H01L 2924/15* (2013.01); *H01L 2924/18161* (2013.01); *H01L 2924/18165* (2013.01)

(58) Field of Classification Search
CPC ........ G06K 19/077; H01L 2224/16225; H01L 2224/16227; H01L 2924/15
See application file for complete search history.

(56) References Cited

U.S. PATENT DOCUMENTS

| | | | | |
|---|---|---|---|---|
| 5,880,935 | A * | 3/1999 | Wiesa | H05K 1/141 228/180.21 |
| 6,333,104 | B1 * | 12/2001 | Perry | H01L 24/10 428/328 |
| 6,409,073 | B1 * | 6/2002 | Kaskoun | G01R 1/0408 228/180.22 |
| 6,759,743 | B2 * | 7/2004 | Ammar | H01L 23/043 257/678 |
| 7,407,081 | B2 * | 8/2008 | Rice | H01L 21/4853 228/11 |
| 7,958,622 | B1 * | 6/2011 | Ayala | G06K 19/07749 235/492 |
| 8,950,681 | B2 * | 2/2015 | Lepp | G06K 19/077 235/492 |
| 2004/0206799 | A1 * | 10/2004 | Wong | B23K 1/0004 228/4.5 |
| 2008/0283615 | A1 * | 11/2008 | Finn | G06K 19/077 235/488 |
| 2009/0029504 | A1 * | 1/2009 | Paik | H01L 21/563 438/108 |
| 2010/0147958 | A1 * | 6/2010 | Martinent | G06K 19/027 235/492 |
| 2011/0023289 | A1 * | 2/2011 | Finn | G06K 19/07722 29/601 |
| 2014/0152511 | A1 * | 6/2014 | Merlin | G06K 19/077 343/700 MS |
| 2014/0239474 | A1 * | 8/2014 | Pueschner | H01L 21/50 257/690 |
| 2015/0227829 | A1 * | 8/2015 | Finn | G06K 19/07752 235/488 |
| 2015/0286916 | A1 * | 10/2015 | Ziemkus | G06K 19/0722 324/626 |
| 2018/0032854 | A1 * | 2/2018 | Pueschner | G06K 19/0723 |

FOREIGN PATENT DOCUMENTS

| | | | |
|---|---|---|---|
| EP | 2 541 471 A | 1/2013 | |
| FR | 2 752 077 A1 | 2/1998 | |
| FR | 2 753 819 A1 | 3/1998 | |
| FR | 2 863 747 A1 | 6/2005 | |
| FR | 2 938 380 A1 | 5/2010 | |
| GB | 2548639 A * | 9/2017 | ....... G06K 19/07743 |
| JP | 2011-107865 A | 6/2011 | |

\* cited by examiner

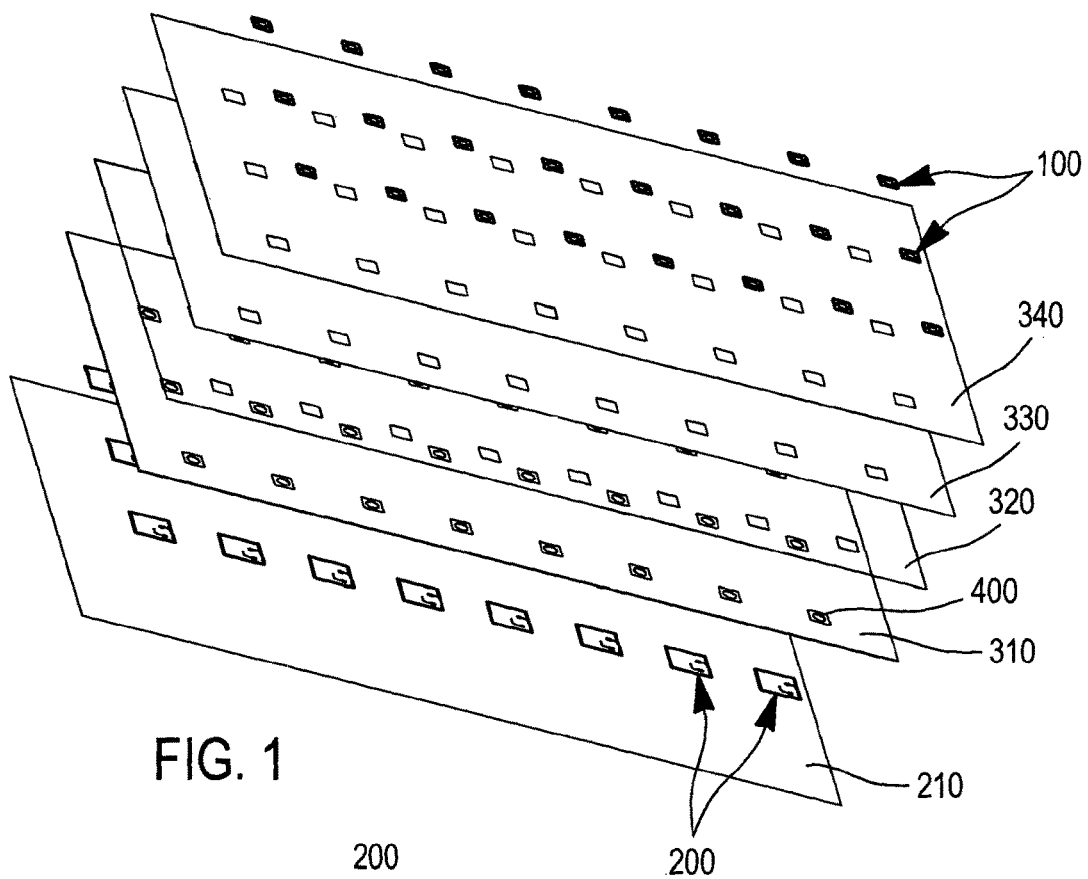
FIG. 1
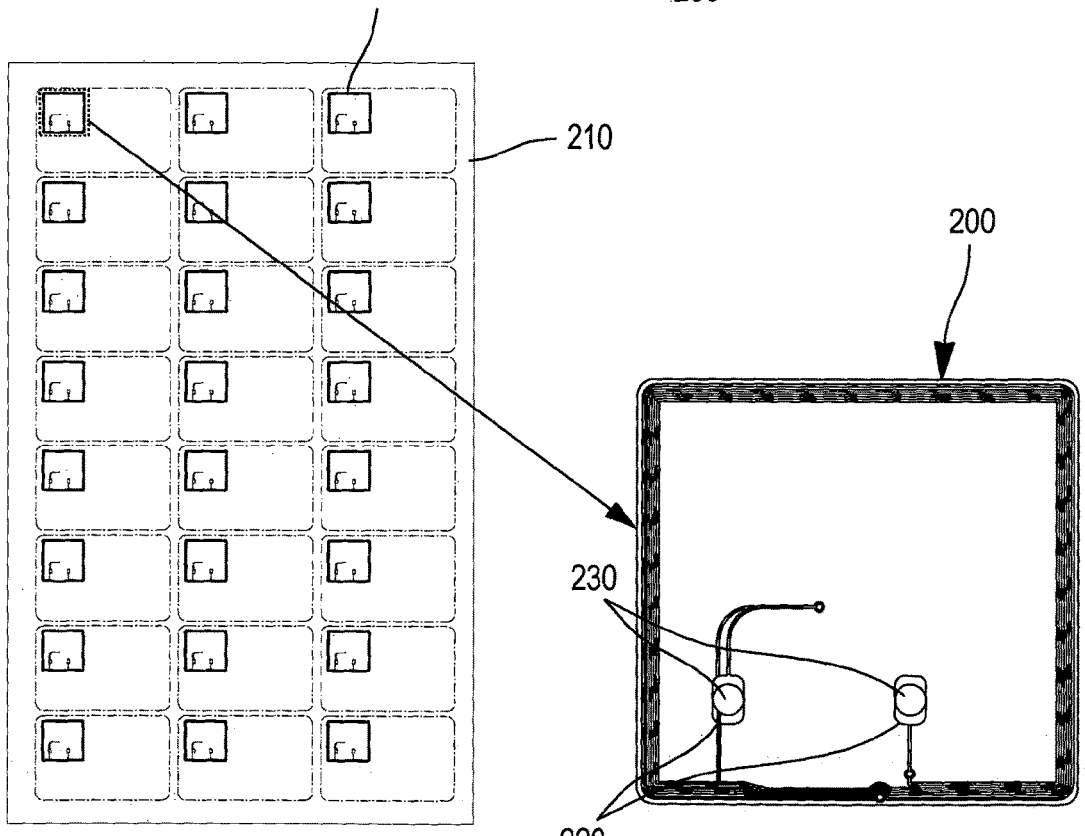
FIG. 2
FIG. 3

CHIP CARD MANUFACTURING METHOD, AND CHIP CARD OBTAINED BY SAID METHOD

The invention relates to the field of chip cards. Chip cards are well known to the public, who have many uses for them: payment cards, SIM cards for mobile telephones, transport cards, identity cards, etc.

Chip cards have transmission means for transmitting data from an electronic chip (integrated circuit) to a card-reader device (reading) or from this device to the card (writing). These transmission means may be "contact", "contactless", or else dual interface when they combine the two above-mentioned means. In particular, the invention makes it possible to produce dual-interface chip cards. Dual-interface chip cards are referred to as "dual" cards if the "contact-based" and "contactless" modes are managed by a single chip, or "hybrid" cards if the "contact-based" and "contactless" modes are managed by two physically separate chips.

Dual-interface chip cards generally consist of a rigid carrier made of plastic, such as PVC, PVC/ABS, PET or polycarbonate, forming most of the card, into which are incorporated an electronic module and an antenna that are manufactured separately. The electronic module has a, generally flexible, printed circuit board equipped with an electronic chip and contact lands connected electrically to the chip and exposed to view on the electronic module and on the surface of the carrier that forms the card, for connection by electrical contact with a card-reader device. Dual-interface chip cards furthermore have at least one antenna for transmitting data between the chip and a radiofrequency system, enabling data to be read or written contactlessly.

In the prior art, the electronic module comprising the contacts and the chip, on the one hand, and the antenna possibly integrated into an inlay, on the other hand, are generally manufactured separately, and then the antenna is connected to the module on which the chip is mounted and connected. The antenna and the module are connected using complex methods that have a negative effect on productivity, manufacturing yield and the reliability of the cards during use thereof.

One aim of the invention is to render this type of method more simple and reliable.

This aim is achieved at least in part by virtue of a method for manufacturing a chip card as claimed in claim 1.

The deposition of solder or brazing material (consisting for example of a tin-bismuth alloy), for example in the form of drops, on the connection pads of the antenna makes it possible to produce an antenna inlay product (inlay with an antenna) that can be marketed as is, in order to be inlaid into layers of plastic and connected to a module mounted in the card at a later point. This product is ready to use and facilitates the operations of the card manufacturer. Indeed, this card manufacturer now needs only to assemble a number of elements (inlay with an antenna, module and sheets of plastic), which may be supplied separately. The operation of connecting the module to the antenna is greatly simplified by the use of the solder material that is already in place on the connection pads of the antenna. Furthermore, this operation may take place at the same time as that of fixing or bonding the module in its cavity, either using only the solder material itself or using a bonding material such as a heat-reactivatable adhesive (hotmelt), a single heating operation then being necessary in order both to connect the module to the antenna and to fix the module in its cavity.

Moreover, a double-sided module (that is to say with contacts on one side and conductive tracks on the other) may also be produced and marketed separately. The antenna is connected to the chip via the solder joint between the connection pads of the antenna and the conductive tracks of the back side of the module.

Additionally, the drops of solder material are possibly also deposited on those conductive tracks of the module which are intended for the connection of the antenna.

The method according to the invention may include any one of the features of claims 2 to 12, taken separately or in combination.

The method according to the invention may be implemented reel-to-reel.

According to another aspect, the invention is an antenna inlay for a chip card as claimed in one of claims 13 to 17. According to yet another aspect, the invention is a method for manufacturing such an antenna inlay as claimed in claim 18. According to yet another aspect, the invention is a chip card as claimed in one of claims 19 to 26.

Other features and advantages of the invention will become apparent on reading the detailed description and from the appended drawings, in which:

FIG. 1 shows a schematic, perspective view of a stack of layers forming a structure for a chip card according to the invention;

FIG. 2 shows a schematic, transparent view of a portion of a strip of antenna inlays;

FIG. 3 shows a schematic, transparent, magnified view of a zone of the strip from FIG. 2 having an antenna;

According to one mode of implementation of the method for manufacturing a chip card according to the invention, modules 100, on the one hand, and antennae 200 on an inlay 210, on the other hand, are produced (see FIG. 1).

Figure 6:
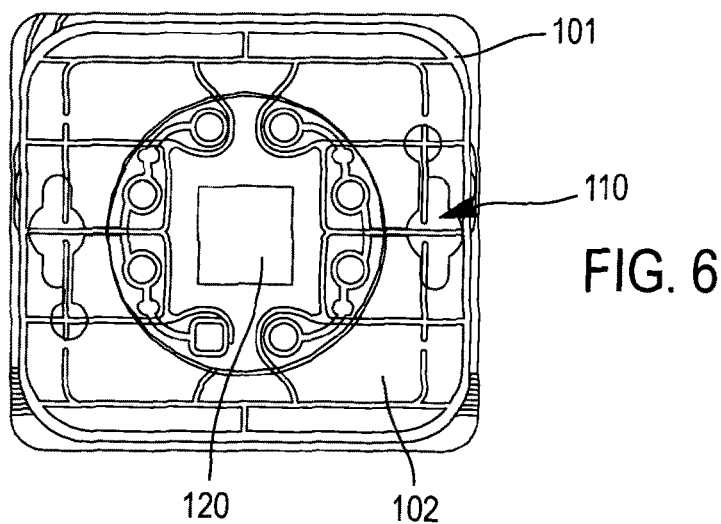
FIG. 6 shows a schematic, transparent view of the cut-out zone from FIGS. 3 and 4, with a module housed in this cut-out zone.

As shown in FIG. 6 (transparently, that is to say showing the patterns present on both sides of the substrate 101), each module 100 is produced, for example in a known manner, on a double-sided substrate 101 having contacts 102 on one side (termed the "contact side" or "front side") and conductive tracks 110 and an electronic chip 120 on the other (termed the "back side" or "bonding side"). The electronic chip 120 is fixed on the substrate 101 using at least one known technique, such as die attachment, and said chip is electrically connected to the contacts 102 and to the conductive tracks 110 by at least one known technique, such as flip-chip technology, wire-bonding, etc. The chip 120 and, if it has any, its wired connections to the contacts 102 and to the conductive tracks 110 are advantageously protected by encapsulation in a resin ("globe top" or "dam and fill", corresponding to UV or thermal encapsulation). With the chip positioned on the back side of the substrate or in a cutout produced in the latter, the encapsulation is performed from this back side and the resin may jut out with respect to the latter in a particular zone that hereinafter will be termed the "encapsulation zone".

The antenna 200 is also produced, for example in a known manner, on a double-sided substrate with plated through-holes between the ends of the antenna on one side of the inlay 210 and connection pads 220 produced on the other side (see FIG. 3—transparently, that is to say showing the patterns present on both sides of the inlay 210). The inlay 210 for the antenna 200 is made of plastic, and more particularly of PVC, for example.

Figure 8:
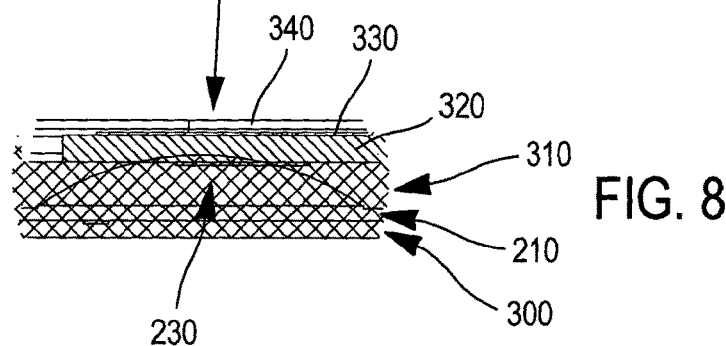
FIG. 8 shows a schematic, magnified view of a zone of the chip card from FIG. 7.

A solder material 230, for example in the form of drops of solder, is placed on each of the connection pads 220 of the antenna. Each drop of solder material 230, after it has been deposited on a connection pad 220 and prior to the heating operation used to form the solder joint between the antenna 200 and the module 100, forms a dome having a height of between 0.02 and 0.5 mm. Advantageously, as can be seen in FIG. 8, each drop of solder material 230, prior to heating, protrudes from the surface of the cavity 400. During heating, each drop of solder material 230 must in effect come into contact with the conductive tracks 110. The wettability of the molten solder material may possibly be sufficient to establish the contact, even if the drop of solder material were to be only flush with the surface of the cavity on which the module 100 comes to rest. However, it is possible to avoid insufficient or defective contact on account of an insufficient wettability by adjusting the height of each drop of solder material 230 such that this height is greater than at least the thickness of the layer (or possibly of a plurality of layers) that will be deposited on the antenna inlay 210 and opposite which the conductive tracks 110 will be positioned. This feature is particularly advantageous when the module 100 is fixed in its cavity using a heat-reactivatable adhesive that may form an excess thickness that impedes or prevents a drop of solder material 230 from making contact with the conductive track 110 with which it must be connected.

Figure 4:
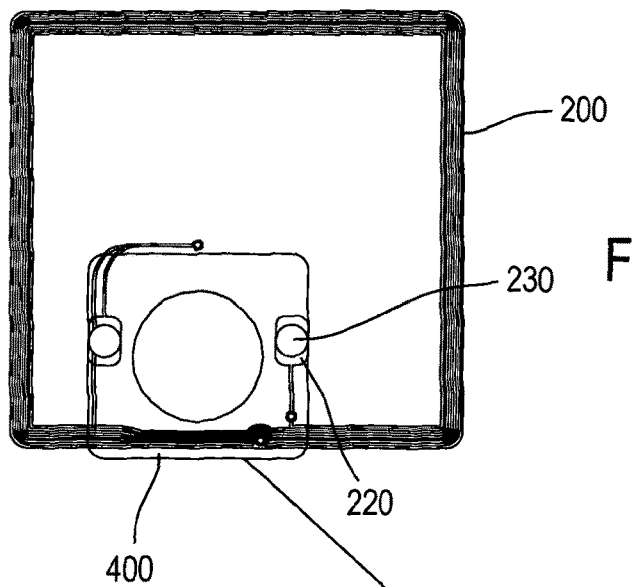
FIG. 4 shows a schematic, transparent view of a zone cut out in a layer positioned in the zone from FIG. 3.
Figure 5:
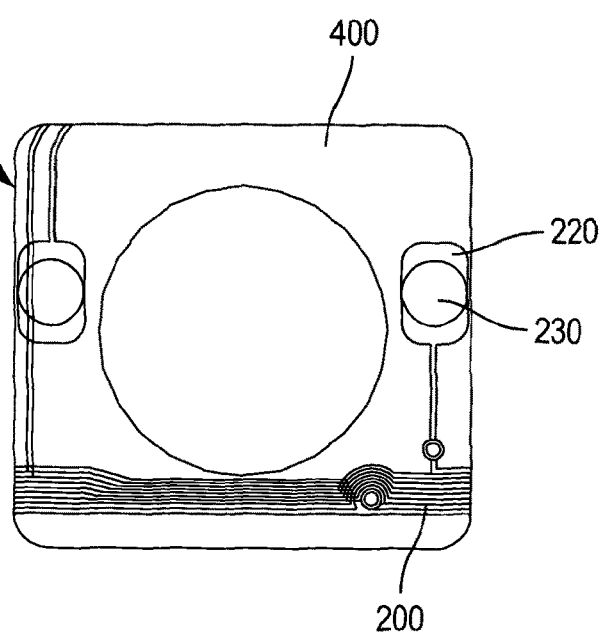
FIG. 5 shows a schematic, transparent, magnified view of the cut-out zone from FIG. 4.

The antenna inlay 210 is then laminated between layers of plastic (PVC for example) 300, 310, 320, 330, 340, while leaving cavities 400, in each of which a module 100 may be housed, unobstructed. Each cavity 400 is such that the connection pads of the antenna and its drops of solder material 230 remain accessible (FIGS. 4 and 5).

Figure 7:
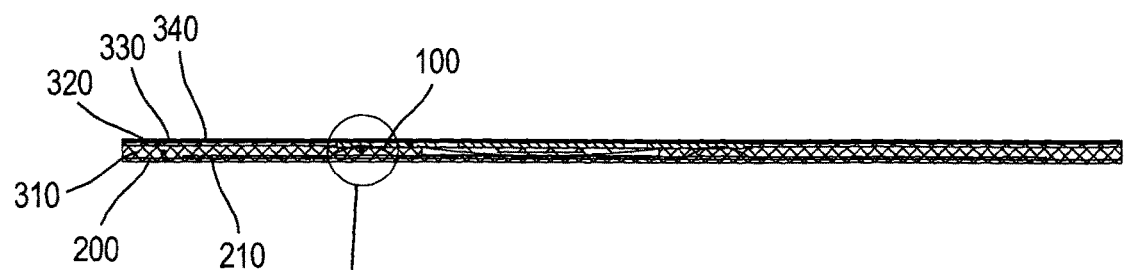
FIG. 7 shows a schematic, cross-sectional view of an example of a chip card obtained by the method according to the invention.

The various layers of plastic are for example (see also FIGS. 7 and 8):
- a bottom layer (or possibly a plurality of bottom layers) 300 for finishing (for example printing) and protecting the card, these layers being located on the inlay 210; the thickness of this bottom layer made of PVC is for example 0.1 mm thick after lamination; this layer does not have a cutout intended for the production of the cavity 400 for receiving a module;
- a spacer layer 310, made of PVC, having a thickness of 0.4 mm after lamination, for example, located on the inlay 210; this spacer layer 310 has a cutout corresponding to a cavity 400;
- a printing layer 320, made of PVC, having a thickness of 0.1 mm after lamination, for example, featured on which are decorations intended to be visible on the card, said layer being located on the spacer layer 310 and likewise having a cutout corresponding to a cavity 400;
- a first finishing layer 330, made of PVC, having a thickness of 0.05 mm after lamination, located above the printing layer 320, and; this first finishing layer 330 has a cutout corresponding to a cavity 400;
- an upper second finishing and protective layer 340, made of PVC, likewise having a thickness of 0.05 mm after lamination and located on the first finishing layer 330; this second upper finishing and protective layer 340 has a cutout corresponding to a cavity 400.

The total thickness of all of layers 300-340, and therefore of the card, is approximately 0.7 mm after lamination.

As an alternative, rather than producing the cutouts in the various layers 310, 320, 330, 340 laminated above the inlay 210 of the antenna 200 in order to produce the cavity 400, the cavity 400 is milled prior to the module 100 being connected and fixed in the cavity 400.

A module 100 is then positioned in each cavity 400 such that two connection tracks 110 intended for the connection of an antenna 200 to a chip 120 are each situated opposite a connection pad 220.

The zones of the module 100 situated at the level of the drops of solder material 230 are then heated in order to melt the solder material 230 and to solder the connection pads 220 of the antenna 200 to these connection tracks 110. This heating operation is for example carried out at the same time as that of heating the dots of heat-reactivatable adhesive that make it possible to bond each module 100 in its cavity 400. These dots of heat-reactivatable adhesive are in fact very close to the drops of solder material 230 positioned on the connection pads 220 of the antenna 200. They may therefore possibly both be heated during the same operation. By selecting a solder material 230 having a melting point of between 120° C. and 230° C., and more preferably between 160° C. and 190° C., it is possible to perform the operation of heating the solder material 230, by applying a temperature of between 120° C. and 250° C. to a zone of the module 100, using a thermode for example.

On account of the thickness of the module 100 and of the dome height of a drop of solder material 230, when the solder material melts, it wets the corresponding connection pad 220 (see FIG. 8).

Figure 9:
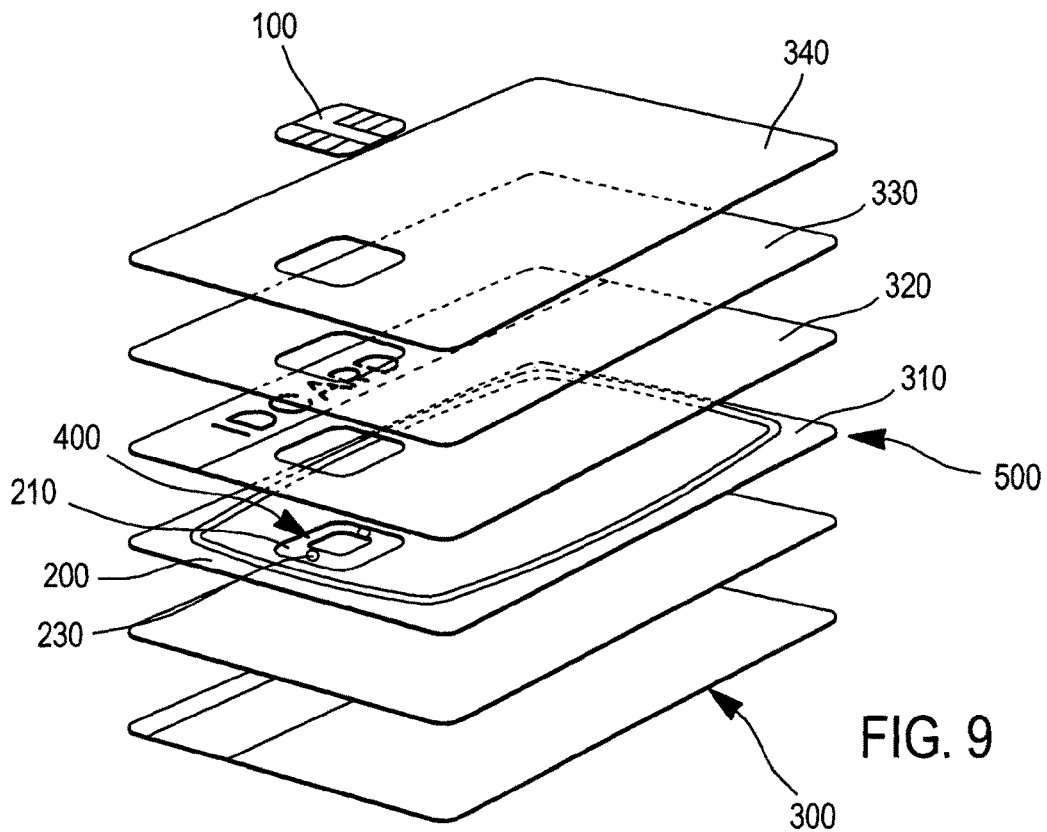
FIG. 9 shows another example of a chip card obtained by the method according to the invention.

Another embodiment of the invention is described hereinbelow. FIG. 9 shows a structure 500 for a chip card, having an antenna 200 that is inserted, as is or resting on an inlay (the antenna having already been laminated to form a product ready to be inlaid) by lamination between printing and finishing layers that are identical or similar to those already described.

This structure 500 has drops of solder material 230 at the level of the connection pads of the antenna 200 and an aperture (milled or cut out of the various layers 310, 320, 330, 340 beforehand) intended for the production of the cavity 400. When the cavity 400 is milled, the various layers 310, 320, 330, 340 are advantageously laminated above the inlay 210 of the antenna 200, without a cutout corresponding to the cavity 400. The cavity 400 is in effect milled through these various laminated layers 310, 320, 330, 340 before the module 100 is connected and fixed in the cavity 400 thus milled. As a variant, it is possible to produce a similar structure from a wired antenna inserted into a inlay (for example using a "wire embedding" technique). The ends of this antenna have pads that receive drops of solder material, making it possible to solder the ends of this antenna to conductive tracks of the module.

Figure 10:
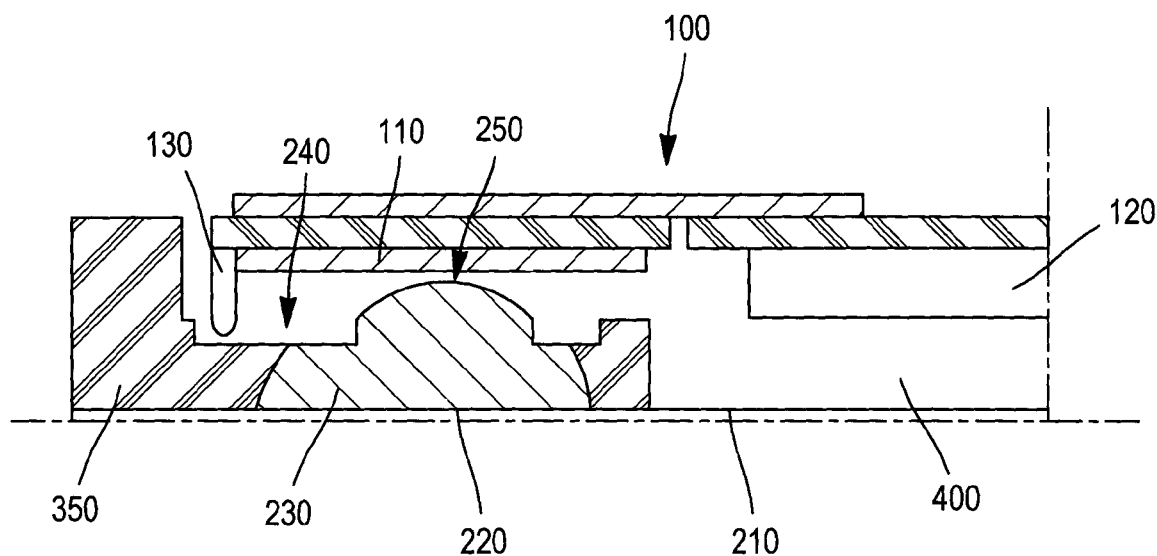
FIG. 10 shows a schematic view of a cross-sectional portion of another example of a chip card obtained according to another mode of implementation of the method according to the invention.

According to another variant illustrated by FIG. 10, a drop of solder material 230 is arranged on each of the connection pads 220 of the antenna, as described above. The antenna inlay 210 is then laminated between various layers 350 of plastic (PVC for example), then the cavity 400 in which a module 100 may be housed is milled. This milling makes it possible not only to produce the various parts of the cavity 400 intended, not only, on the one hand, to accommodate the chip 120, possibly encapsulated with its wired connections (not shown), and, on the other hand, to form the surfaces intended to adhere to a heat-reactivatable adhesive 130 for fixing the module 100 in the cavity 400, but also to clear from a part of each drop of solder material 230 the plastic that forms the various layers 350 between which the antenna inlay 210 has been inserted and then laminated. The milling is carried out to depth, over at least part of the perimeter of the solder material 230, in order to clear from the solder material 230 the layers 350 laminated above the inlay 210, but also so that the solder material 230 (prior to heating) protrudes above the surface of the cavity 400. For example, a recess 240 is formed during the milling, around each drop of solder material 230 (or at least at least over a part of the perimeter of each of them). The bottom of this recess 240 is therefore located below the upper level 250 of this drop of solder material. For example, the recess has a depth of between 20 and 200 μm.

Advantageously, during the milling of the cavity 400, a part of each drop of solder material 230 is removed in order to ensure that the plastic in which the milling is carried out will not prevent the surfaces to be soldered from being brought together or the material that forms the drops of molten solder material 230 from wetting the conductive tracks 110. Thus, for example, the milling is carried out in a circular manner all around each drop of solder material 230.

According to another mode of implementation of the method for manufacturing a chip card according to the invention, illustrated by FIGS. 11 to 14, modules 100 (FIG. 12), on the one hand, and antennae 200 on an inlay 210 (FIG. 13), on the other hand, are produced. Moreover, soldering units 235 (FIG. 11) are also produced.

Figure 11:
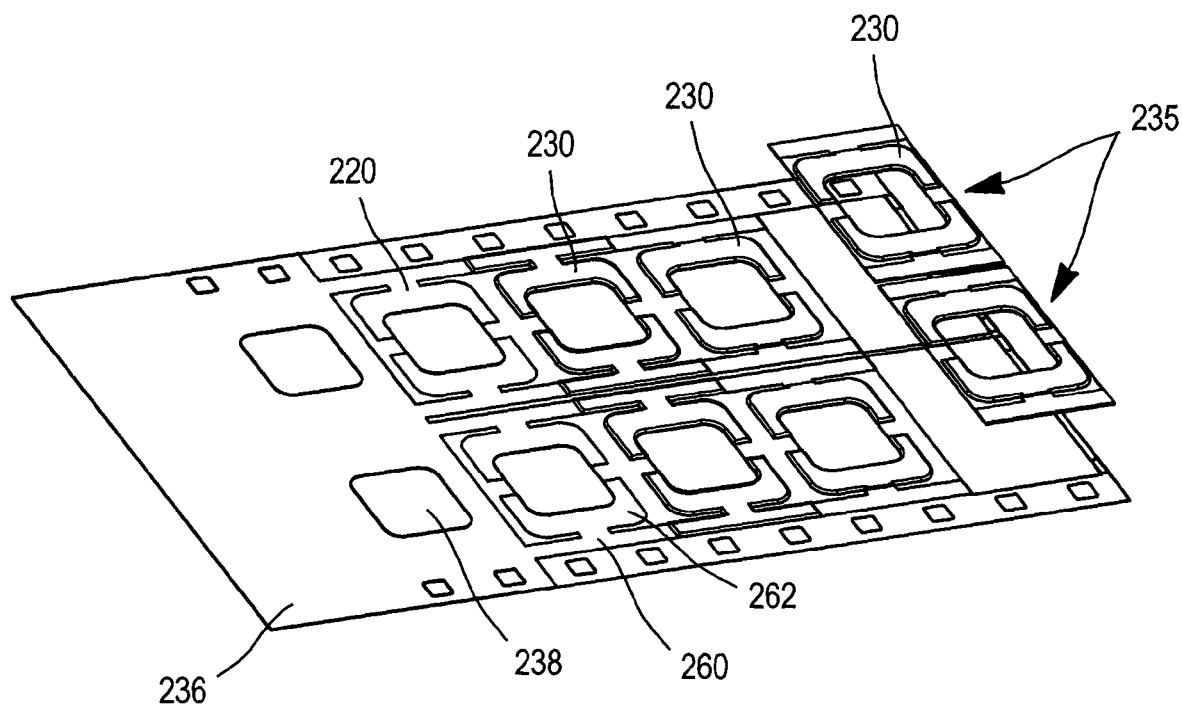
FIG. 11 shows a schematic, perspective view of various steps of a method for producing a soldering and fixing unit, for performing yet another mode of implementation of the method according to the invention.

As illustrated in FIG. 11, the soldering units 235 are produced (for example continuously, reel-to-reel) from a flexible film 236 (for example of "copper-clad" type). This flexible film has a conductive layer on one side. This flexible film is cut out (by punching for example) in order to form apertures 238 intended to receive the resin for encapsulating a module 100. Driving notches are also cut out. The conductive layer is then etched (for example using photolithography techniques) in order to form connection pads 220 (two connection pads 220 per soldering unit 235). Each connection pad 220 has a metalized zone with a first 260 and a second 262 portion. The first portion 260 is substantially rectangular in shape. The second portion 262 is in the shape of a U that extends around the apertures 238, with the base of the U being linked (connected) essentially to the middle of the first portion in question along its longitudinal direction. Solder material 230 is then deposited on the connection pads 220, for example with a thickness of between 0.02 and 0.5 mm, for example. The solder material is removed from the first portions 260. Lastly, the soldering units 235 are cut out in order to be individualized.

Figure 12:
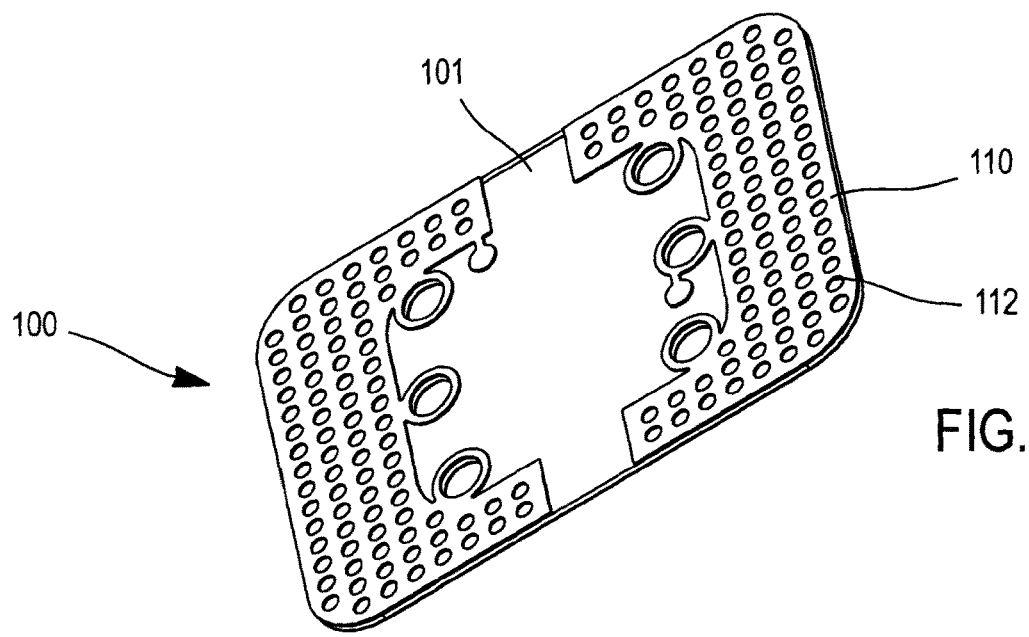
FIG. 12 shows a schematic, perspective view of a module that can be used with a soldering unit such as that illustrated in FIG. 11.

As illustrated in FIG. 12, fastening structures 112 are produced on the back side of the module 100, on the connection tracks 110 (the module 100 is here shown without the chip, the connection wires and the encapsulation resin). These fastening structures 112 comprise round holes produced by etching the conductive tracks 110, for example. Of course, many other shapes (square, triangle, arbitrary shape, etc.) may be envisioned. Each conductive track 110 extends in the shape of a U partially around the zone intended to receive the chip, the connection wires and the encapsulation resin.

Figure 13:
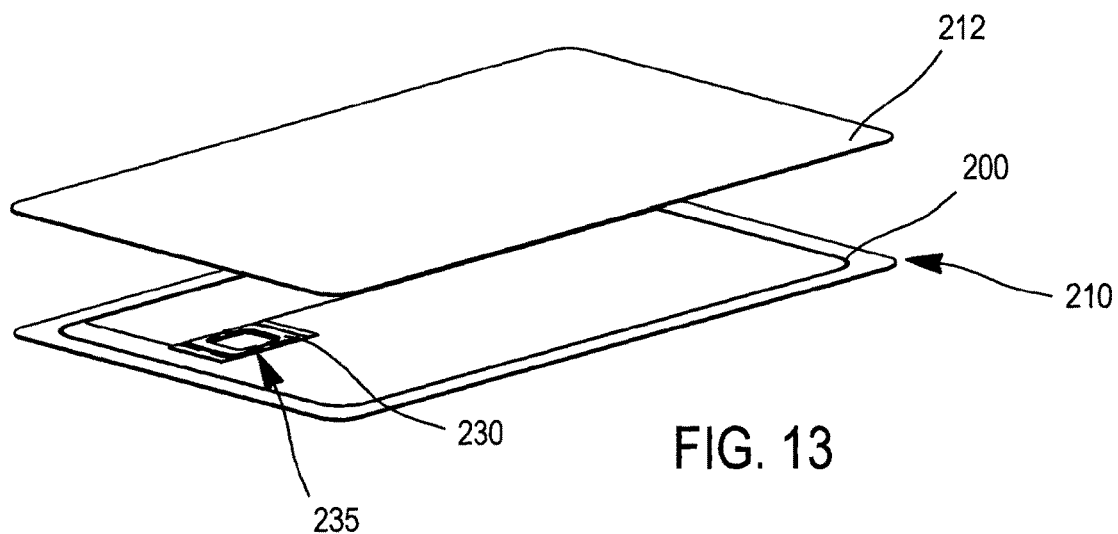
FIG. 13 shows a schematic view of an antenna inlay incorporating a soldering unit such as that illustrated in FIG. 11.
Figure 14:
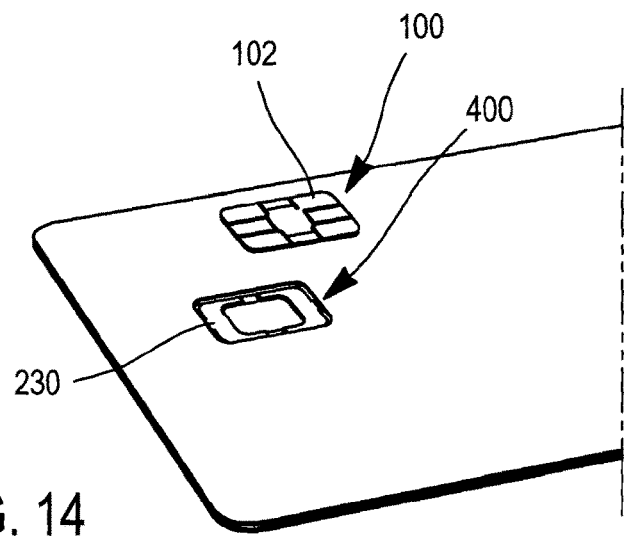
FIG. 14 shows a schematic, perspective view of a portion of an antenna inlay such as that shown in FIG. 13, inserted into a card structure, and after milling of the cavity for receiving a module such as that illustrated in FIG. 12.

Moreover, as shown in FIG. 13, a metal antenna 200 is etched or deposited (for example by "wire embedding") on an insulating inlay 210.

A soldering unit 235 is positioned (and possibly bonded) on or in the inlay 210 and the ends of the antenna 200 are connected (for example by thermocompression) to the first portions 260 of the connection pads 220. This assembly, consisting of the antenna 200 and of the soldering unit 235 on their inlay 210, is coated with a layer of plastic 212. This structure (the antenna 200, the soldering unit 235, the inlay 210 and the layer 212) forms an antenna inlay that may be sold in order to be inserted into a more complex multilayer structure intended for the production of a chip card.

Thus, for example after insertion of this structure into a complex multilayer such as that described in relation to FIG. 9 (in this case, the structure comprising the antenna 200, the inlay 210 and the layer 212 replaces the structure 500), a cavity 400 is milled (see FIG. 14) in order to house a module 100 therein. The milling may be carried out in a manner similar to the method described in relation to FIG. 10.

The first portions 260 of the connection pads 220, to which the ends of the antenna 200 have been connected, are situated outside of the milled zone and remain protected by the layer 212 and the layers laminated on the latter. Only the second portions 262 of the connection pads 220 that are covered with the solder material are accessible in the cavity 400 after milling. Once the module 100 has been housed in the cavity 400, the conductive tracks 110 and their fastening structures 112 are situated opposite the solder material 230 deposited on the second portions 262 of the connection pads 220.

A thermode is then applied to the front side of the module 100 in order to melt the solder material 230 between the conductive tracks 110 and the connection pads 220.

The respective area of the conductive tracks 110 (without considering the holes of the fastening structures 112) and of the connection pads 220 is for example between 2 and 20 mm$^2$, but it will be understood that a land of solder material 230 having an area approaching or close to 20 mm$^2$ may enable more solid fixing of the module 100 in the cavity 400, but, as the amount of soldering material to be melted is greater, it is necessary to provide more heat.

The holes of the fastening structures 112 have a diameter of between 0.1 and 2 mm, for example.

A pull-off force of the module 100 that is great enough to meet the specifications for this type of product is therefore obtained. The solder material 230 thus makes it possible not only to establish an electrical connection between the conductive tracks 110 and the connection pads 220, but also to fix the module 100 in the cavity 400 without the aid of any other adhesive.

The invention claimed is:

1. A method for manufacturing a chip card, the method comprising:

providing a chip card module having a substrate, contacts and a chip card module, where the substrate comprises a first main side and a second main side, where the contacts are on the first main side for a temporary electrical connection to a contact-based card-reading device, and, where the chip card module is on the second main side and comprises an electronic chip connected to at least some of the contacts and to at least two conductive tracks intended for the connection of an antenna, providing an antenna, on an antenna inlay, for electromagnetic coupling to a contactless card-reading device, the antenna having two ends, providing an individualized soldering unit which comprises connection pads, where solder material is provided on the connection pads, connecting the two ends of the antenna to respective ones of the connection pads, laminating the antenna inlay and the individualized soldering unit between at least one upper layer of plastic and at least one bottom layer of plastic, and positioning the chip card module in a cavity formed in at least the upper layer of plastic, once the chip card module has been positioned in the cavity, heating the solder material to solder each of the conductive tracks of the chip card module to respective ones of the connection pads.

2. The method as claimed in claim 1, wherein the solder material on each of the connection pads protrudes, prior to heating thereof, from the surface of the cavity.

3. The method as claimed in claim 1, wherein the cavity formed in at least the upper layer of plastic is milled thereby producing at least one recess associated with at least one of the connection pads, where the recess comprises a base of which is located below an upper level of the solder material deposited on the at least one connection pad.

4. The method as claimed in claim 3, wherein the recess receives a material for bonding the chip card module in the cavity.

5. The method as claimed in claim 3, wherein the recess has a depth of between 20 and 200 μm.

6. The method as claimed in claim 1, wherein each connection pad has a metalized zone with a first portion and a second portion, and wherein the antenna is connected to the first portion and the solder material is deposited on the second portion.

7. The method as claimed in claim 1, wherein the solder material on each of the connection pads is deposited in a form of a land with an area which is at least equal to 2 mm$^2$.

8. The method as claimed in claim 1, wherein the at least two conductive tracks have fastening structures.

9. The method as claimed in claim 1, wherein the solder material comprises a material having a melting point of between 120° C. and 230° C.

10. The method as claimed in claim 1, wherein the solder material is heated by applying a temperature of between 120° C. and 250° C. to a zone of the chip card module.

11. The method as claimed in claim 1, wherein the antenna inlay has a PVC substrate.

12. The method as claimed in claim 1, wherein the layers of plastic are made of PVC.

13. The method as claimed in claim 1, wherein the individualized soldering unit is positioned on the antenna inlay.

14. The method as claimed in claim 1, wherein the individualized soldering unit is positioned into the antenna inlay.

15. The method as claimed in claim 1, wherein the solder material comprises a material having a melting point of between 160° C. and 190° C.

16. An antenna inlay for a chip card, the antenna inlay comprising:
an antenna configured to enable electromagnetic coupling to a contactless card-reading device, the antenna having two ends,
an individualized soldering unit comprising connection pads, where the connections pads are connected to respective ones of the two ends of the antenna.

17. The antenna inlay as claimed in claim 16, where the antenna inlay further comprises a PVC substrate.

18. An antenna inlay as claimed in claim 16, where the antenna inlay further comprises a solder material on each of the connection pads the thickness of the solder material being between 0.02 and 0.5 mm.

19. The antenna inlay as claimed in claim 18, wherein the solder material on each of the connection pads forms a soldering land, where each of the solder lands has an area which is at least equal to 2 mm$^2$.

20. The antenna inlay as claimed in claim 18, wherein the solder material comprises a tin-bismuth alloy.

21. A method for comprising:
providing an antenna inlay for a chip card, where the antenna inlay comprises an antenna configured to enable electromagnetic coupling to a contactless card-reading device, the antenna having two ends,
providing an individualized soldering unit which comprises connection pads, where solder material is provided on the connection pads,
connecting the antenna ends to respective ones of the connection pads.

22. A chip card comprising
a chip card module having a substrate, at least two conductive tracks on the substrate, contacts on the substrate and an electronic chip on the substrate, where the substrate comprises a first main side and a second main side, where the contacts are provided on the first main side of the substrate for a temporary electrical connection to a contact-based card-reading device, where the conductive tracks are one the second main side of the substrate, and where the electronic chip is connected to at least some of the contacts and to the at least two conductive tracks,
an antenna on an antenna inlay, where the antenna is configured for electromagnetic coupling to a contactless card-reading device, the antenna having two ends,
an individualized soldering unit which comprises connection pads, where solder material is provided on the connection pads, where the two ends of the antenna are connected to respective ones of the connection pads,
the antenna inlay and the individualized soldering unit being laminated between at least one upper layer of plastic and at least one bottom layer of plastic, and
the chip card module being housed in a cavity formed in at least the upper layer of plastic.

23. The chip card as claimed in claim 22, wherein the solder material has a thickness of between 0.02 and 0.5 mm.

24. The chip card as claimed in claim 22, wherein the solder material comprises a tin-bismuth alloy.

25. The chip card as claimed in claim 22, wherein the solder material on each of the connection pads each form a land, where each of the lands has an area which is at least equal to 2 mm$^2$.

26. The chip card as claimed in claim 22, wherein each connection pad has a metalized zone with a first portion and a second portion, and wherein the antenna is connected to the first portion and the chip card module is connected to the second portion by the solder material.

27. The chip card as claimed in claim 26, wherein the conductive tracks have fastening structures facing the second portion.

28. The chip card as claimed in claim 22, wherein the antenna inlay has a PVC substrate.

29. The chip card as claimed in claim 22, wherein each of the at least two two conductive tracks is soldered to each of the connection pads by a solder material having a melting point of between 120° C. and 230° C.

30. The chip card as claimed in claim 22, wherein each of the at least two conductive tracks is soldered to each of the connection pads by a solder material having a melting point of between 160° C. and 190° C.

* * * * *